United States Patent
Camillo-Castillo et al.

(10) Patent No.: US 9,722,057 B2
(45) Date of Patent: Aug. 1, 2017

(54) BIPOLAR JUNCTION TRANSISTORS WITH A BURIED DIELECTRIC REGION IN THE ACTIVE DEVICE REGION

(71) Applicant: GLOBALFOUNDRIES INC., Grand Cayman (KY)

(72) Inventors: Renata Camillo-Castillo, Essex Junction, VT (US); Vibhor Jain, Essex Junction, VT (US); Marwan H. Khater, Astoria, NY (US)

(73) Assignee: GLOBAL FOUNDRIES Inc., Grand Cayman (KY)

( * ) Notice: Subject to any disclaimer, the term of this patent is extended or adjusted under 35 U.S.C. 154(b) by 87 days.

(21) Appl. No.: 14/747,668

(22) Filed: Jun. 23, 2015

(65) Prior Publication Data
US 2016/0380088 A1    Dec. 29, 2016

(51) Int. Cl.
*H01L 29/737* (2006.01)
*H01L 21/265* (2006.01)
(Continued)

(52) U.S. Cl.
CPC .... *H01L 29/7371* (2013.01); *H01L 21/26586* (2013.01); *H01L 21/764* (2013.01);
(Continued)

(58) Field of Classification Search
CPC ......... H01L 29/66234; H01L 29/66242; H01L 29/66272; H01L 29/66287; H01L 29/66295; H01L 29/73; H01L 29/732; H01L 29/7322; H01L 29/7371; H01L 29/7373; H01L 29/7375; H01L 29/7376; H01L 29/7378; H01L 29/0804; H01L 29/0817; H01L 29/0821; H01L 29/1004; H01L 29/41708; H01L 29/42304; H01L 29/6628; H01L 29/66303; H01L 29/6631;
(Continued)

(56) References Cited

U.S. PATENT DOCUMENTS 4,470,852 A    9/1984    Ellsworth
5,039,624 A *  8/1991    Kadota ............. H01L 29/42304
                                              148/DIG. 10
(Continued)

FOREIGN PATENT DOCUMENTS

JP    2003347310 A    12/2003
JP       3755658 B2     3/2006
(Continued)

OTHER PUBLICATIONS

Taiwan Intellectual Property Office, Examination Report received in Application No. 105117542 dated Dec. 16, 2016.

*Primary Examiner* — Khaja Ahmad
(74) *Attorney, Agent, or Firm* — Thompson Hine LLP; Anthony Canale

(57) ABSTRACT

Device structure and fabrication methods for a bipolar junction transistor. A trench isolation region is formed that bounds an active device region along a sidewall. A dielectric region is formed that extends laterally from the sidewall of the active device region into the active device region. The dielectric region is located beneath a top surface of the active device region such that a section of the active device region is located between the top surface and the dielectric region.

20 Claims, 6 Drawing Sheets

(51) Int. Cl.
*H01L 21/762* (2006.01)
*H01L 21/764* (2006.01)
*H01L 29/06* (2006.01)
*H01L 29/08* (2006.01)
*H01L 29/66* (2006.01)

(52) U.S. Cl.
CPC .... *H01L 21/76237* (2013.01); *H01L 29/0649* (2013.01); *H01L 29/0821* (2013.01); *H01L 29/66242* (2013.01)

(58) Field of Classification Search
CPC ...... H01L 29/66318–29/6634; H01L 29/7325; H01L 29/7327; H01L 29/737
See application file for complete search history.

(56) References Cited

U.S. PATENT DOCUMENTS

| | | | |
|---|---|---|---|
| 6,144,086 A | 11/2000 | Brown et al. | |
| 6,380,017 B1* | 4/2002 | Darwish | H01L 29/0804 257/565 |
| 6,680,522 B1* | 1/2004 | Sato | H01L 29/66242 257/587 |
| 6,864,560 B2 | 3/2005 | Khater et al. | |
| 6,964,907 B1* | 11/2005 | Hopper | H01L 21/30608 257/517 |
| 7,064,360 B2* | 6/2006 | Franosch | H01L 29/7378 257/197 |
| 7,071,047 B1 | 7/2006 | Furukawa et al. | |
| 7,342,293 B2 | 3/2008 | Wallner et al. | |
| 7,368,361 B2* | 5/2008 | Park | H01L 29/0821 257/578 |
| 7,396,732 B2* | 7/2008 | Kunnen | H01L 21/762 257/E21.545 |
| 7,521,772 B2 | 4/2009 | Adam et al. | |
| 7,732,292 B2* | 6/2010 | Khater | H01L 29/1004 438/320 |
| 8,754,450 B2 | 6/2014 | Miu et al. | |
| 8,957,456 B1 | 2/2015 | Camillo-Castillo | H01L 29/737 257/197 |
| 8,975,146 B2 | 3/2015 | Camillo-Castillo et al. | |
| 9,231,074 B2* | 1/2016 | Camillo-Castillo | H01L 29/0649 |
| 9,245,951 B1* | 1/2016 | Camillo-Castillo | H01L 29/0826 |
| 2003/0107106 A1* | 6/2003 | Ahmed | H01L 21/8249 257/584 |
| 2004/0110354 A1* | 6/2004 | Natzle | H01L 21/31116 438/365 |
| 2004/0222497 A1* | 11/2004 | Dunn | H01L 21/8249 257/578 |
| 2004/0262715 A1* | 12/2004 | Miura | H01L 29/0821 257/565 |
| 2005/0151193 A1 | 7/2005 | Wong | |
| 2005/0151225 A1* | 7/2005 | Adam | H01L 29/1004 257/565 |
| 2006/0060886 A1* | 3/2006 | Dunn | H01L 29/7378 257/197 |
| 2006/0097350 A1* | 5/2006 | Khater | H01L 29/1004 257/565 |
| 2006/0148187 A1* | 7/2006 | Yoon | H01L 29/0821 438/321 |
| 2006/0154476 A1* | 7/2006 | Freeman | H01L 29/66242 438/637 |
| 2007/0126080 A1* | 6/2007 | Wallner | H01L 29/0649 257/565 |
| 2007/0275535 A1* | 11/2007 | Khater | H01L 29/1004 438/345 |
| 2007/0298578 A1* | 12/2007 | Khater | H01L 29/66242 438/322 |
| 2008/0305602 A1* | 12/2008 | Fu | H01L 29/66242 438/312 |
| 2011/0057266 A1* | 3/2011 | Wallner | H01L 21/8249 257/378 |
| 2011/0198671 A1 | 8/2011 | Boccardi et al. | |
| 2012/0098039 A1 | 4/2012 | Miu et al. | |
| 2012/0132961 A1* | 5/2012 | Vanhoucke | H01L 29/0821 257/197 |
| 2012/0168908 A1* | 7/2012 | Vanhoucke | H01L 29/0817 257/565 |
| 2013/0277804 A1* | 10/2013 | Cheng | H01L 29/66287 257/586 |
| 2014/0084420 A1* | 3/2014 | Adkisson | H01L 29/66242 257/565 |
| 2014/0151852 A1 | 6/2014 | Adkisson et al. | |
| 2014/0175520 A1* | 6/2014 | Fu | H01L 29/66318 257/197 |
| 2014/0327111 A1* | 11/2014 | Camillo-Castillo | H01L 29/0653 257/586 |
| 2014/0361300 A1* | 12/2014 | Camillo-Castillo | H01L 29/1004 257/51 |
| 2015/0021738 A1* | 1/2015 | Camillo-Castillo | H01L 29/0649 257/565 |
| 2015/0035011 A1 | 2/2015 | Camillo-Castillo et al. | |
| 2015/0053982 A1 | 2/2015 | Camillo-Castillo et al. | |
| 2015/0060950 A1 | 3/2015 | Camillo-Castillo et al. | |
| 2015/0318384 A1* | 11/2015 | Boeck | H01L 29/732 257/586 |
| 2016/0087073 A1* | 3/2016 | Camillo-Castillo | H01L 29/0649 257/197 |

FOREIGN PATENT DOCUMENTS

| | | |
|---|---|---|
| TW | 200524047 B | 1/2005 |
| TW | 200711004 A | 3/2007 |

* cited by examiner

BIPOLAR JUNCTION TRANSISTORS WITH A BURIED DIELECTRIC REGION IN THE ACTIVE DEVICE REGION

BACKGROUND

The invention relates generally to semiconductor devices and integrated circuit fabrication and, in particular, to fabrication methods and device structures for a bipolar junction transistor.

Bipolar junction transistors may be found, among other end uses, in high-frequency and high-power applications. In particular, bipolar junction transistors may find specific end uses in amplifiers for wireless communications systems and mobile devices, switches, and oscillators. Bipolar junction transistors may also be used in high-speed logic circuits. Bipolar junction transistors are three-terminal electronic devices that include an emitter, an intrinsic base, and a collector defined by regions of different semiconductor materials. In the device structure, the intrinsic base situated between the emitter and collector. An NPN bipolar junction transistor may include n-type semiconductor material regions constituting the emitter and collector, and a region of p-type semiconductor material constituting the intrinsic base. A PNP bipolar junction transistor includes p-type semiconductor material regions constituting the emitter and collector, and a region of n-type semiconductor material constituting the intrinsic base. In operation, the base-emitter junction is forward biased and the base-collector junction is reverse biased. The collector-emitter current may be controlled by the base-emitter voltage.

Improved fabrication methods and device structures are needed for a bipolar junction transistor.

SUMMARY

In an embodiment of the invention, a method is provided for fabricating a device structure. A trench isolation region is formed that bounds an active device region along a sidewall. A dielectric region is formed that extends laterally from the sidewall of the active device region into the active device region. The dielectric region is located beneath a top surface of the active device region such that a section of the active device region is located between the top surface and the dielectric region.

In an embodiment of the invention, a device structure is provided for a bipolar junction transistor. The device structure includes a trench isolation region in the semiconductor substrate, an active device region having a top surface and a sidewall coextensive with the trench isolation region, and a dielectric region extending laterally from the sidewall of the active device region into the active device region. The active device region is comprised of a portion of the semiconductor substrate. The dielectric region located beneath a top surface of the active device region such that a section of the active device region is located between the top surface and the dielectric region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
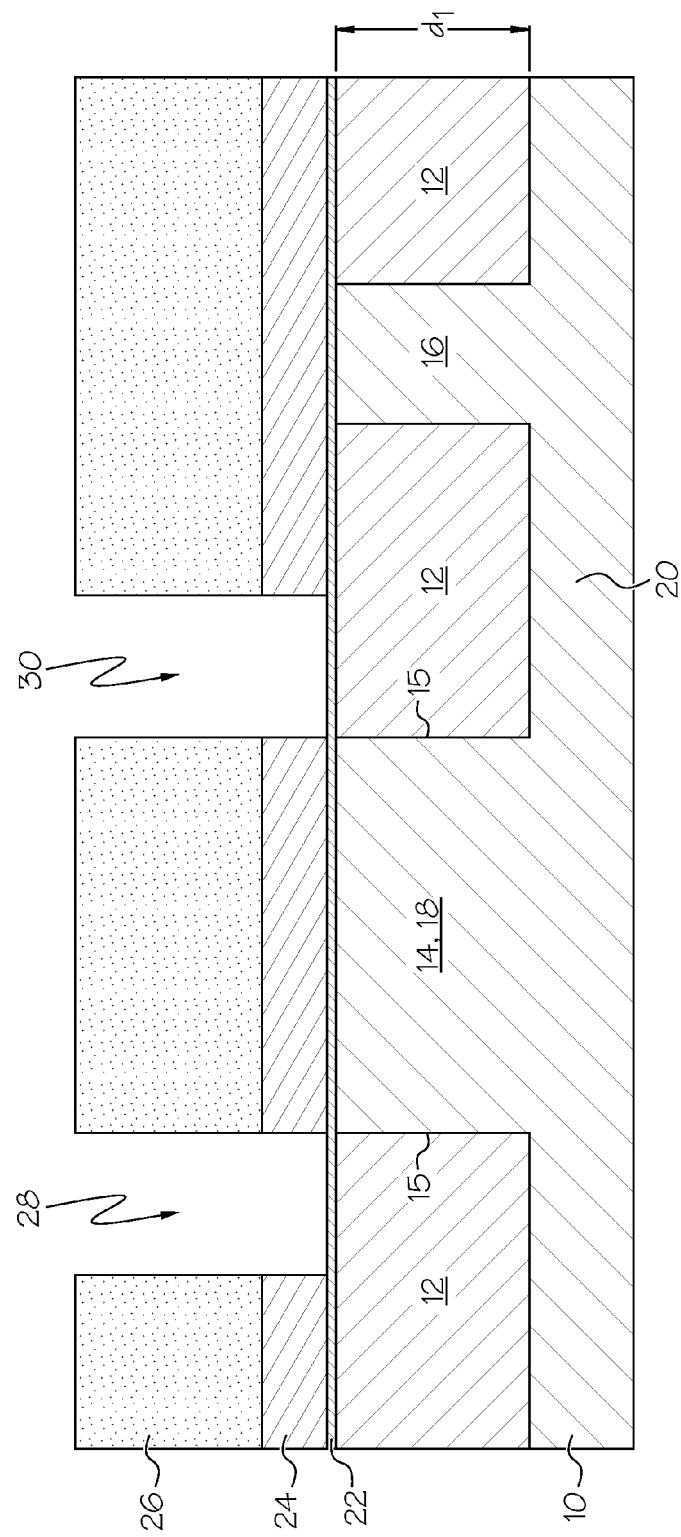
FIGS. 1-5 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 comprises a single-crystal semiconductor material usable to form the devices of an integrated circuit. For example, the substrate 10 may be comprised of monocrystalline silicon-containing material, such as a bulk single-crystal silicon wafer. The semiconductor material constituting the substrate 10 may comprise an electrically-active dopant that alters its electrical properties and may also include an optional epitaxial layer at its top surface.

Trench isolation regions 12 are formed in the substrate 10 and extend to a given depth $d_1$ into the substrate 10. The trench isolation regions 12 define, and furnish electrical isolation for, an active device region 14 and a collector contact region 16 each comprised of the semiconductor material of the substrate 10. The collector contact region 16 is positioned adjacent to the active device region 14 and is separated from the active device region 14 by one of the trench isolation regions 12. The locations and arrangement of the trench isolation regions 12 define the size, geometrical shape, and outer perimeter of the active device region 14 and the location of the collector contact region 16. The active device region 14 has sidewalls 15 located at its perimeter and coextensive with contacting complementary sidewalls of the trench isolation regions 12 over the depth $d_1$.

The trench isolation regions 12 may be formed by a shallow trench isolation (STI) technique that involves defining trenches with lithography and dry etching processes, depositing an electrical insulator to fill the trenches, and planarizing the electrical insulator relative to the top surface of substrate 10 using, for example, chemical mechanical polishing (CMP). The trench isolation regions 12 may be comprised of a dielectric material, such as an oxide of silicon (e.g., silicon dioxide ($SiO_2$)) deposited by chemical vapor deposition.

The active device region 14 may define a collector 18 of a bipolar junction transistor or may include the collector 18. The collector 18 may constitute all or a portion of the active device region 14, and may be comprised of the semiconductor material of the substrate 10. The electrical conductivity of the collector 18 may be elevated by, for example, an ion implantation of an electrically-active dopant or the growth of a doped epitaxial layer at the top surface of the substrate 10. A sub-collector 20 may extend laterally at depth in the substrate 10 that is beneath the trench isolation regions 12 in order to couple the collector 18 with the collector contact region 16. The collector contact region 16, collector 18, and sub-collector 20 are comprised of the semiconductor material of the substrate 10 and have a common conductivity type.

Dielectric layers 22, 24 are sequentially deposited, and a patterned etch mask 26 is applied. The dielectric layers 22, 24 may each be comprised of an electrical insulator with a dielectric constant (e.g., permittivity) characteristic of a dielectric material. In one embodiment, the dielectric layer 22 may be comprised of silicon dioxide deposited by chemical vapor deposition (CVD), and the dielectric layer 24 may be comprised of silicon nitride ($Si_3N_4$) deposited using chemical vapor deposition. The etch mask may be comprised of a layer of a light-sensitive material, such as an organic photoresist, that may be applied by a spin coating process, pre-baked, exposed to light projected through a photomask, baked after exposure, and developed with a chemical developer. The etch mask 26 includes openings 28, 30 that are located relative to the active device region 14 at intended locations for trenches that extend into the trench isolation regions 12.

The dielectric layers 22, 24 are etched by an etching process using an etch chemistry selected to remove the constituent dielectric materials and extend the openings to the top surface of the trench isolation regions 12, thereby defining a patterned hardmask for subsequent etch processes. The etching processing may comprise a wet chemical etching process or a dry etching process, such as reactive-ion etching (RIE). The etch mask 26 may be subsequently removed. If comprised of a photoresist, the etch mask 26 may be removed by ashing or solvent stripping, followed by a cleaning process.

Figure 2:
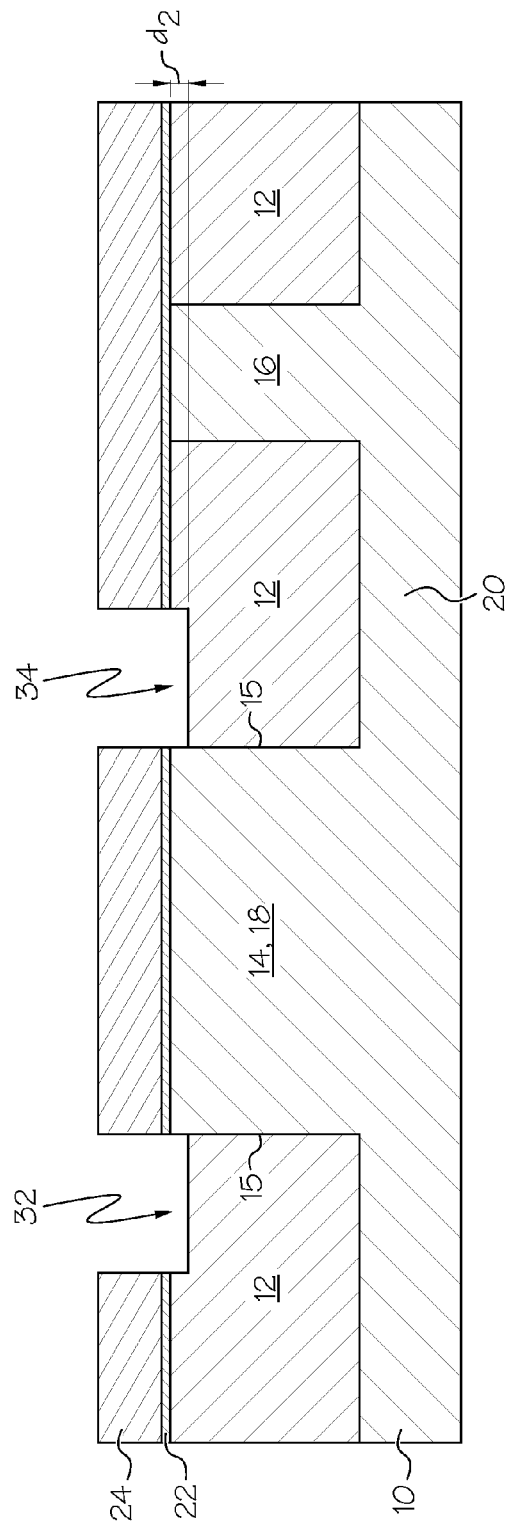

With reference to FIG. 2 in which like reference numerals refer to like features in FIG. 1 and at a subsequent fabrication stage of the processing method, trenches 32, 34 are defined in the trench isolation regions 12 at the locations of the openings 28, 30 using an etching process. The etching process used to etch the dielectric material of the trench isolation regions 12 has an etch chemistry selected to remove the dielectric material at a higher rate than (i.e., selective to) the semiconductor material of active device region 14 and the dielectric layer 24. The etching processing may comprise a dry etching process, such as reactive-ion etching (RIE). The etching process is timed such that the trenches 32, 34 extend into the trench isolation regions 12 to a depth $d_2$ that is less than the depth $d_1$. Consequently, the trenches 32, 34 only extend partially through the trench isolation regions 12 and not into the underlying substrate 10. The trenches 32, 34 are coextensive with the active device region 14 and do not penetrate into its sidewalls 15.

Figure 3:
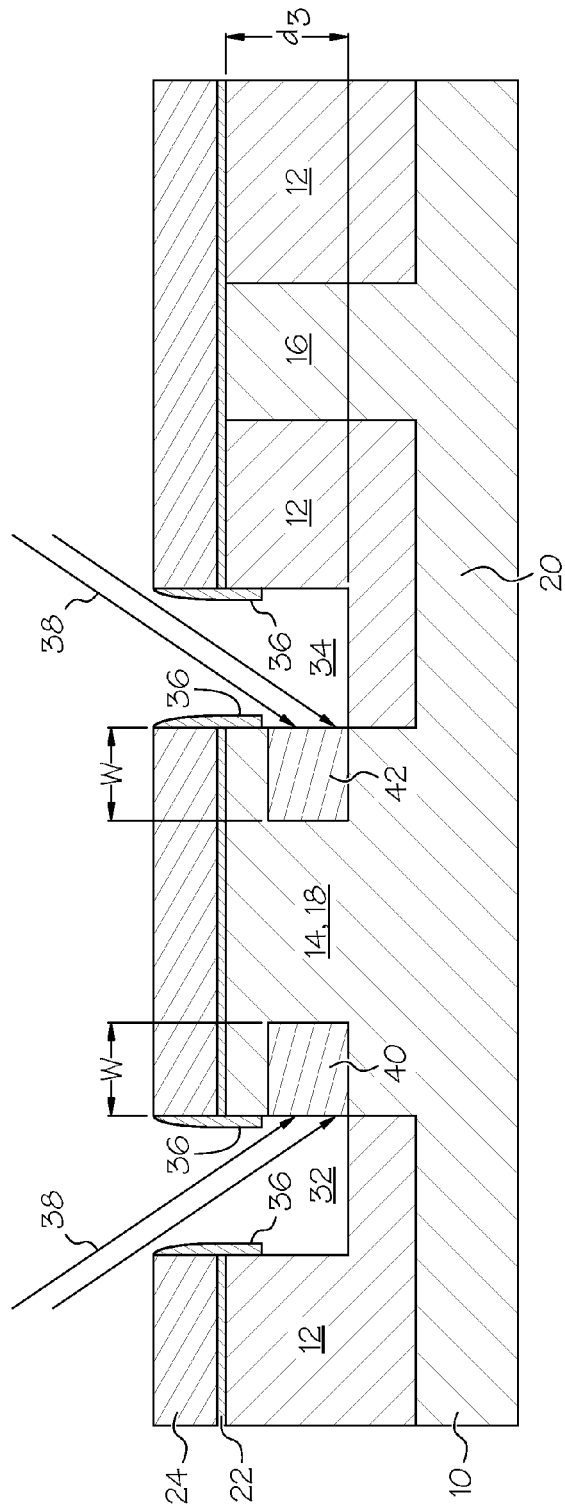

With reference to FIG. 3 in which like reference numerals refer to like features in FIG. 1 and at a subsequent fabrication stage of the processing method, spacers 36 are formed on the sidewalls bordering the trenches 32, 34 after the initial partial etch of the trenches 32, 34. An anisotropic etching process may be used to shape spacers 36 from a conformal dielectric layer. The spacers 36 may be comprised of an electrical insulator, such as silicon nitride ($Si_3N_4$) deposited using chemical vapor deposition. The spacers 36 are sacrificial elements that are subsequently removed in the processing flow and, as a result, are absent in the completed device structure.

After the spacers 36 are formed, the trenches 32, 34 are extended to a greater depth into the trench isolation regions 12 at the locations of the openings 28, 30 using an etching process. The etching process used to etch the dielectric material of the trench isolation regions 12 has an etch chemistry selected to remove the dielectric material at a higher rate than (i.e., selective to) the semiconductor material of active device region 14, and the dielectric materials of the spacers 36 and dielectric layer 24. The etching processing may comprise a dry etching process, such as reactive-ion etching (RIE). The etching process is timed such that the trenches 32, 34 extend into the trench isolation regions 12 to a depth $d_3$ that is less than the depth $d_1$ but greater than depth $d_2$. Consequently, at the conclusion of this subsequent partial etch, the trenches 32, 34 still only extend partially through the trench isolation regions 12 and not into the underlying substrate 10. The trenches 32, 34 remain coextensive with the active device region 14 and do not penetrate into its sidewalls 15.

Energetic ions, as indicated diagrammatically by the single-headed arrows 38, are introduced into the active device region 14 using ion implantation to form damaged regions 40, 42 of the active device region 14. The ion trajectories impinge the sidewalls 15 of the active device region 14 with access provided by the trenches 32, 34 and the ions 38 penetrate into the semiconductor material of the active device region 14 beneath the sidewalls 15 with a range and range straggle. The implantation conditions (e.g., angle, ion energy, dose) may be modified to tune the characteristics of the damaged regions 40, 42. In one embodiment, the ions 38 may be positive ions of argon (Ar) that are implanted at a selected or specified angle. In another embodiment, the ions 38 may be positive ions of silicon (Si) or germanium (Ge) that are implanted at a selected or specified angle. As used herein, the term "angled implantation" denotes that the ion trajectories impinge the top surface of the active device region 14 traveling at incident angles greater than or less than 0°, wherein 0° represents a direction normal (i.e., perpendicular) to the top surface of the substrate 10. The ion trajectories of ions 38 are also angled relative to the sidewall 15 of the active device region 14. The damaged regions 40, 42 may be formed by using chained implants (e.g., multiple discrete implantations at different energies and/or different species (e.g., Ar or Ge)), and may be formed without introducing ions comprising an electrically-active dopant into the semiconductor material of the active device region 14.

The crystal structure of the damaged regions 40, 42 is altered by implantation damage from the ions 38. The shape of the damaged regions 40, 42 and their penetration depth into the active device region 14 can be controlled by changing, among other factors, implantation conditions such as the implant angle and the ion energy, as well as the width and depth of the trenches 32, 34 and the location of the spacers 36. The spacers 36 operate as an implantation mask for sections of the active device region 14 above the damaged regions 40, 42 and the trench isolation regions 12 operated as an implantation mask for sections of the active device region 14 below the damaged regions 40, 42. The location of the spacers 36 is determined by controlling the initial partial etch that extends the trenches 32, 34 to depth $d_2$. The thickness of the damaged regions 40, 42 is equal to a difference between depth $d_2$ and depth $d_3$, and is established by controlling the subsequent partial etch that extends the trenches 32, 34 to depth $d_3$. The damaged regions 40, 42 extend laterally a specified width W from the sidewalls of the trench isolation regions 12 and the sidewall 15 of the active device region 14 into the perimeter of the active device region 14.

Following the ion implantation, the crystal structure of the damaged regions 40, 42 differs from the crystal structure of the overlying, laterally adjacent, and underlying semiconductor material of the active device region 14. For example, the semiconductor material of the damaged regions 40, 42 may be rendered non-crystalline by amorphization by the ion implantation such that crystallinity is absent in comparison with the single crystal semiconductor material of the active device region 14. The damaged regions 40, 42 are bounded from below and above, as well as laterally, by the single-crystal semiconductor material of the active device region 14. The crystallinity difference promotes an etch rate difference or an oxidation rate difference, as discussed below, of the semiconductor material of the damaged regions 40, 42 that permits the damaged regions 40, 42 to be modified without causing modification of the semiconductor material of the active device region 14.

Figure 4:
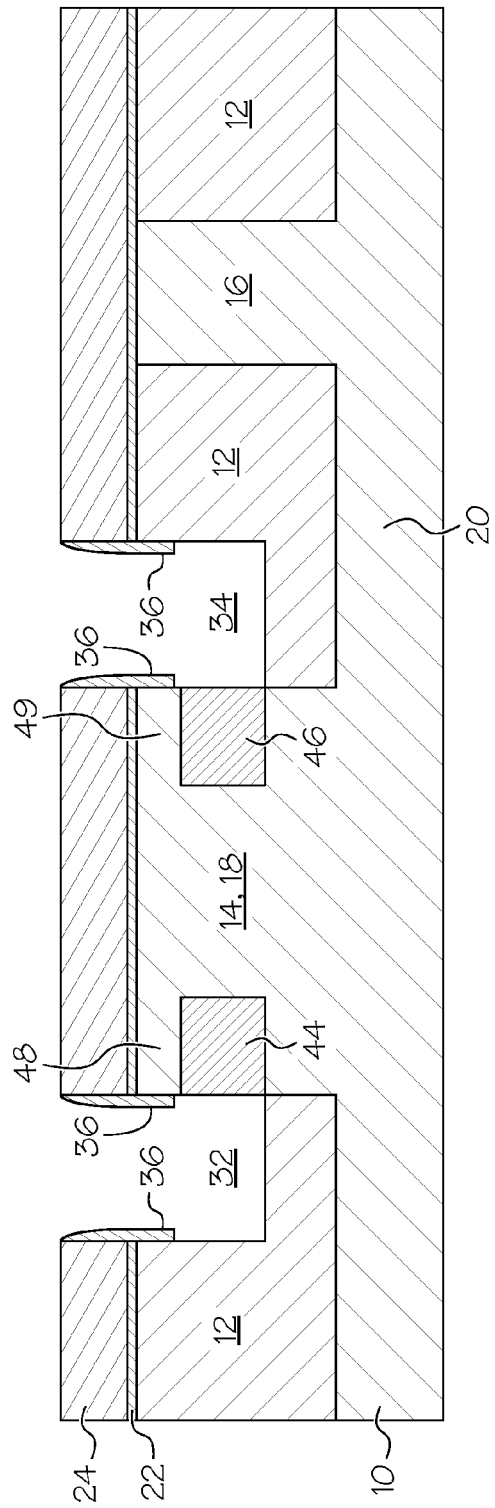

With reference to FIG. 4 in which like reference numerals refer to like features in FIG. 3 and at a subsequent fabrication stage of the processing method, dielectric regions 44, 46 are formed from the damaged regions 40, 42 by converting the damaged semiconductor material of the damaged regions 40, 42 to a dielectric material. The damaged regions 40, 42 may be converted to the dielectric regions 44, 46 using a wet or dry thermal oxidation process and the dielectric regions 44, 46 may comprise silicon dioxide. In one embodiment, the damaged regions 40, 42 are comprised of damaged semiconductor material (e.g., silicon) that oxidizes at a higher rate than the surrounding undamaged semiconductor material (e.g., single crystal silicon) of the active device region 14. The dielectric regions 44, 46 penetrate laterally into the active device region 14 and locally narrow the active device region 14.

The dielectric regions 44, 46 define a secondary buried isolation region extending from the trench isolation regions 12 into the active device region 14 and the collector 18. Sections 48, 49 of the active device region 14 are located between the dielectric regions 44, 46 and the top surface of the active device region 14. Consequently, the dielectric regions 44, 46 are buried beneath the top surface of the active device region 14, and may be spaced away from the top surface of the active device region 14 by a distance (e.g., $d_2$) set during the initial partial etch of the trenches 32, 34. In an embodiment, the dielectric regions 44, 46 are spaced away from the top surface of the active device region 14 by a distance equal to the distance (e.g., $d_2$).

The shape and dimensions of the dielectric regions 44, 46 are related to the shape and dimensions of the damaged regions 40, 42. The height of the dielectric regions 44, 46 is established by the partial etches and the resulting location of the spacers 36 in the trenches 32, 34, and is related to the difference between $d_2$ and $d_3$. In an embodiment, the topmost depth of the dielectric regions 44, 46 may be located at the depth $d_2$ and the bottommost depth of the dielectric regions 44, 46 may be located at the depth $d_3$ such that the dielectric regions 44, 46 extend vertically relative to the top surface of the active device region 14 from depth $d_2$ to depth $d_3$. The width of the dielectric regions 44, 46 is related to the width W of the damaged regions 40, 42 and, in an embodiment, may be equal to the width W of the damaged regions 40, 42.

In an alternative embodiment, the damaged regions 40, 42 may be removed as described below in connection with FIG. 6 and replaced by a dielectric material to form the dielectric regions 44, 46. Candidate inorganic dielectric materials for dielectric regions 44, 46 may include, but are not limited to, silicon dioxide ($SiO_2$), fluorine-doped silicon glass (FSG), and combinations of these dielectric materials. characterized by low dielectric constant compared to silicon dioxide. The dielectric regions 44, 46 may comprise an organic or inorganic dielectric material, which may be an electrical insulator characterized by an electrical resistivity at room temperature of greater than $10^{10}$ (Ω-m). Alternatively, dielectric regions 44, 46 may comprise a low-k dielectric material characterized by a relative permittivity or dielectric constant smaller than the dielectric constant of approximately 3.9 for silicon dioxide. Candidate low-k dielectric materials for dielectric regions 44, 46 include, but are not limited to, spun-on organic low-k dielectrics (e.g., spun-on polymer resins) and inorganic low-k dielectrics (e.g., organosilicate glasses, hydrogen-enriched silicon oxycarbide (SiCOH), and carbon-doped oxides), and combinations of these and other organic and inorganic dielectrics.

Figure 5:
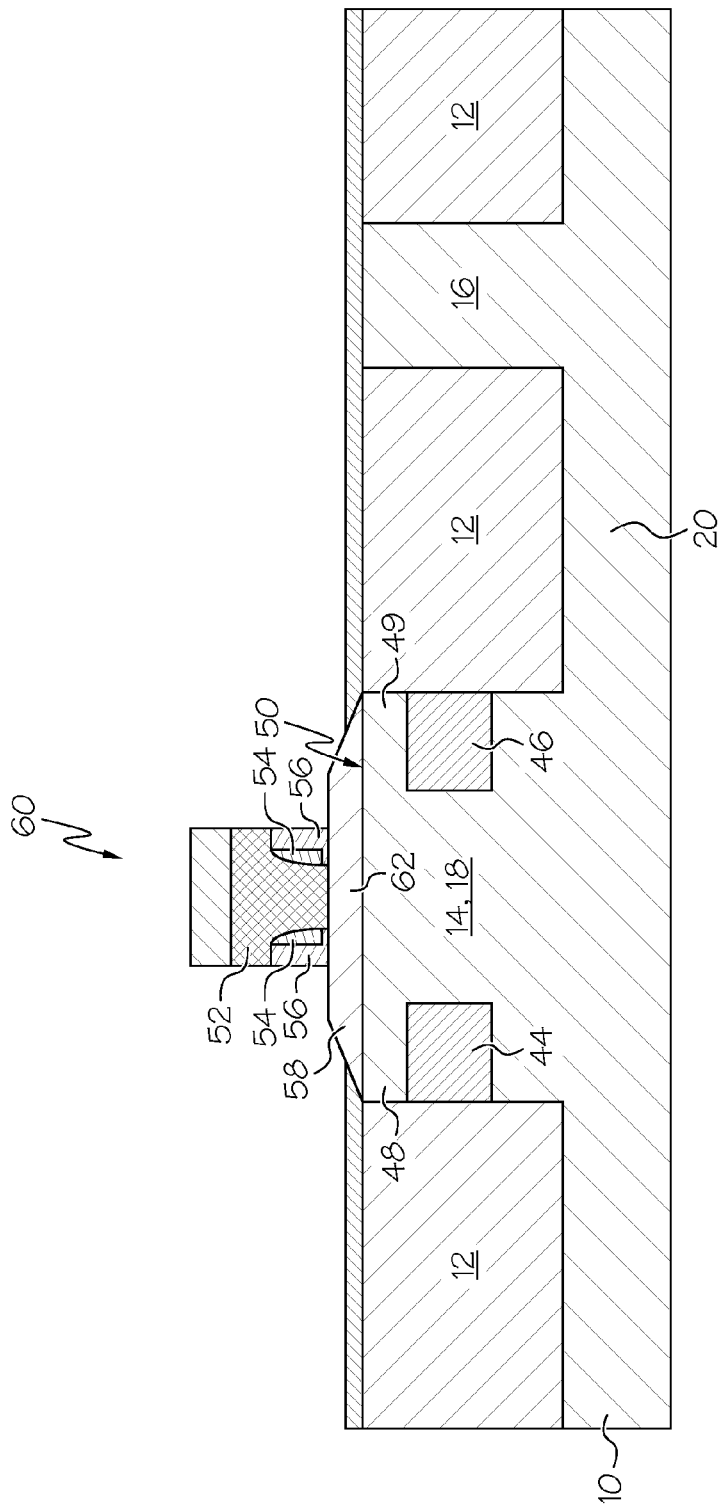

With reference to FIG. 5 in which like reference numerals refer to like features in FIG. 4 and at a subsequent fabrication stage of the processing method, the spacers 36 are removed from the trenches 32, 34 and the trenches 32, 34 are filled with a solid dielectric material that is an electrical insulator so that the trench isolation regions 12 are reformed. In one embodiment, the conformal deposition technique used to deposit the solid dielectric material may be low pressure chemical vapor phase deposition (LPCVD) using a silicon source of either silane or a mixture of silane with nitrogen. In a specific embodiment, the solid dielectric material may be comprised of an oxide of silicon (e.g., $SiO_2$) deposited by LPCVD. The solid dielectric material overlying the top surface may be etched back or polished with chemical mechanical polishing, and the dielectric layers 22, 24 may be removed by wet chemical etching and/or dry etching to restore planarity.

A base layer 50 formed on the top surface of the active device region 14. The base layer 50 may be comprised of a different semiconductor material than the collector 18 and may have an opposite conductivity type from the collector 18. The dielectric regions 44, 46, which have a specified thickness related to the partial etches of the trenches 32, 34 and the numerical difference between depth $d_2$ and depth $d_3$, are in a non-contacting relationship with base layer 50.

The base layer 50 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the base layer 50 may be graded and/or stepped across its thickness. The semiconductor material of the base layer 50 may comprise a dopant, such as a p-type dopant selected from Group III of the Periodic Table (e.g., boron) in a concentration that is effective to impart p-type conductivity and, optionally, carbon (C) to suppress the outdiffusion of the p-type dopant. The base layer 50 may be formed from a semiconductor material layer deposited using a low temperature epitaxial (LTE) growth process, such as vapor phase epitaxy (VPE). The thickness of the base layer 50 may be chosen according to its intended device application with greater layer thicknesses chosen for power amplifier applications.

An emitter 52 is located on a top surface of the base layer 50. The emitter 52 may be comprised of a different semiconductor material than the base layer 50 and may have an opposite conductivity type from the base layer 50. For example, the emitter 52 may lack germanium that is present in at least a portion of the base layer 50. In a representative embodiment, the emitter 52 may be comprised of a semiconductor material, such as silicon, deposited by chemical vapor deposition and may be doped with a concentration of an n-type dopant selected from Group V of the Periodic Table (e.g., phosphorus (P) or arsenic (As)) in a concentration that is effective to impart n-type conductivity.

The emitter 52 is surrounded by non-conductive spacers 54 that clad an emitter opening defined in one or more dielectric layers 56 on the top surface of the base layer 50. The spacers 54 are formed before the emitter 52 is formed. The spacers 54 may be formed by depositing a conformal layer comprised of an electrical insulator, such as $Si_3N_4$ deposited by CVD, and shaping the conformal layer with an anisotropic etching process, such as RIE, that preferentially removes the electrical insulator from horizontal surfaces.

The emitter 52 includes exterior sidewalls that are adjacent to and coextensive with the spacers 54.

An extrinsic base 58 is formed in the base layer 50. The extrinsic base 58 may be formed by introducing a dopant concentration that operates to increase its conductivity relative to the remainder of the base layer 50. In an embodiment, the extrinsic base 58 may be formed by ion implantation and, specifically, by implanting ions of a p-type dopant selected from Group III of the Periodic Table (e.g., boron) in a concentration that is effective to elevate the level of p-type conductivity relative to the remainder of the base layer 50. The dielectric regions 44, 46, which underlie the extrinsic base 58 and the sections 48, 49 of the active device region 14, may reduce the diffusion of the dopant from the extrinsic base 58 through the sections 48, 49 of the active device region 14 and into the collector 18 in the active device region 14.

In an alternative embodiment, the sections 48, 49 of the active device region 14 underlying the extrinsic base 58 may be intentionally doped with a dopant from Group III of the Periodic Table (e.g., boron) in a concentration that is effective to impart p-type conductivity. The p-type conductivity imparted to the semiconductor material of the sections 48, 49 is different from the initial n-type semiconductor material of the sections 48, 49 of the active device region 14. The dopant, which may be introduced by ion implantation, may be effective to reduce the base resistance without increasing the collector-to-base parasitic capacitance in order to improve device efficiency. In effect, the reduction in base resistance is decoupled from any increase in the collector-to-base parasitic capacitance, which promotes independent optimization of these different and often competing device performance metrics. The implanted sections 48, 49 can become part of the link-up region between the intrinsic base and extrinsic base in the device structure.

A device structure 60 for a bipolar junction transistor thus formed by the fabrication stages of the processing method is characterized by a vertical architecture that includes the emitter 52, the collector 18, and an intrinsic base 62 defined by a central section of the base layer 50 that is positioned between the emitter 52 and collector 18. The intrinsic base 62 is coextensive with the collector 18 along a p-n junction, and the emitter 52 is coextensive with the intrinsic base 62 along another p-n junction. The extrinsic base 58 is coupled with the intrinsic base 62 for establishing electrical contact. The bipolar junction transistor may be characterized as a heterojunction bipolar transistor (HBT) if two or all three of the collector 18, the emitter 52, and the intrinsic base 62 are comprised of semiconductor materials with different bandgaps.

The device structure 60 does not include a raised extrinsic base in its construction. The dielectric regions 44, 46 are spaced at a specific distance below the interface between the emitter 52 and the base layer 50. This specific distance is directly related to depth d2 of the initial partial etch of the trenches 32, 34.

During the front-end-of-line (FEOL) portion of the fabrication process, the device structure 60 is replicated across at least a portion of the surface area of the substrate 10. In BiCMOS integrated circuits, complementary metal-oxide-semiconductor (CMOS) transistors may be formed using other regions of the substrate 10. As a result, bipolar junction transistors (or HBTs) and CMOS transistors may be available and co-located on the same substrate 10.

Standard middle-of-line (MOL) processing and back-end-of-line (BEOL) processing follows, which includes formation of dielectric layers, via plugs, and wiring for an interconnect structure coupled with the device structure 60, as well as other similar contacts for additional device structures 60 and any CMOS transistors that may be included in other circuitry fabricated on the substrate 10.

Figure 6:
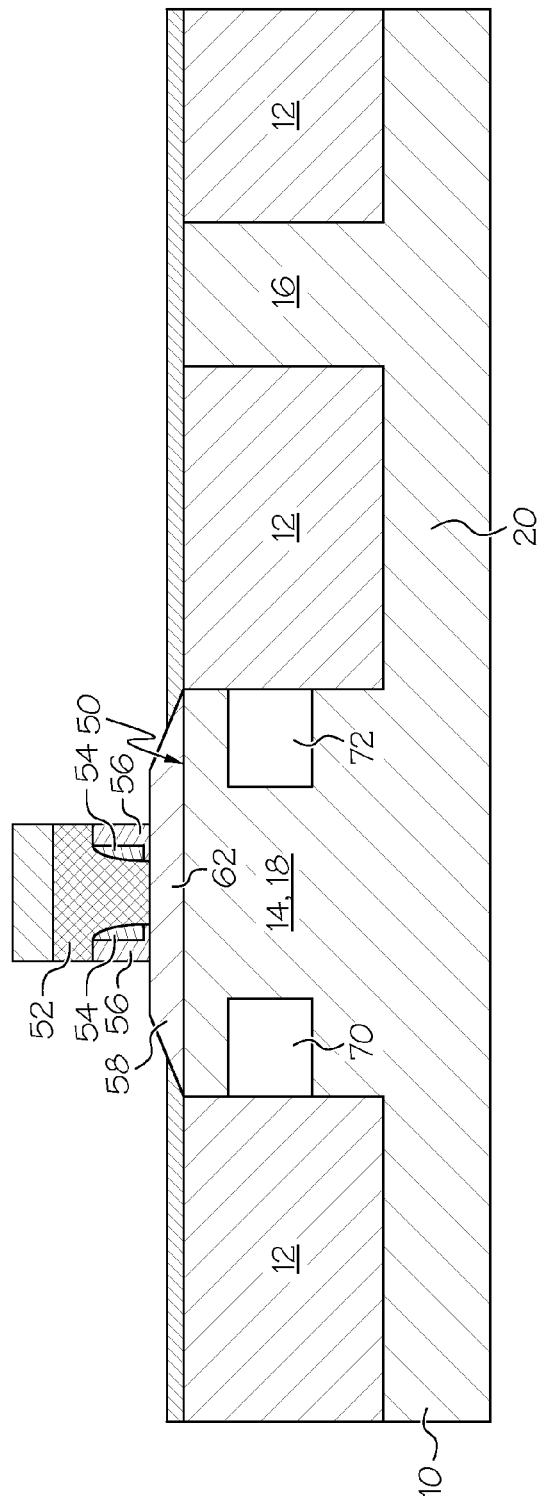
FIG. 6 is a cross-sectional view similar to FIG. 5 of a device structure fabricated by a processing method in accordance with an alternative embodiment of the invention.

With reference to FIG. 6 in which like reference numerals refer to like features in FIG. 5 and at a subsequent fabrication stage of the processing method in accordance with an alternative embodiment of the invention, the dielectric regions 44, 46 (FIG. 5) may be replaced by dielectric regions in the form of air gaps 70, 72, which are formed from the damaged regions 40, 42 by removing the damaged semiconductor material of the damaged regions 40, 42 instead of oxidizing the damaged regions 40, 42 (FIG. 3). In one embodiment, the damaged regions 40, 42 may be removed using an etching process that etches the damaged semiconductor material (e.g., silicon) at a higher rate than the surrounding undamaged semiconductor material (e.g., single crystal silicon) of the active device region 14. Similar to the dielectric regions 44, 46, the air gaps 70, 72 penetrate laterally into the active device region 14 effectively as lateral extensions of the trench isolation regions 12 and locally narrow the active device region 14. The air gaps 70, 72 may be characterized by an effective permittivity or dielectric constant of near unity (vacuum permittivity), or may be filled by air at or near atmospheric pressure, may be filled by another gas at or near atmospheric pressure, or may contain air or another gas at a sub-atmospheric pressure (e.g., a partial vacuum).

The trenches 32, 34 are filled with dielectric material deposited by a directional or non-conformal deposition process such that the air gaps 70, 72 are preserved. The dielectric material comprises an electrical insulator so that the trench isolation regions 12 are re-formed and the air gaps 70, 72 are closed. In one embodiment, the dielectric material may be comprised of silicon dioxide deposited by of an oxide of silicon (e.g., $SiO_2$) deposited by plasma-enhanced chemical vapor deposition (PECVD). The air gaps comprising the dielectric regions 44, 46 each represent empty spaces free of dielectric material.

The process continued with as described in connection with FIG. 5. The air gaps 70, 72 comprising the dielectric regions are thus formed before the base layer 50 is formed, which permits the damaged surfaces surrounding the air gaps 70, 72 to be repaired and passivated before the base layer 50 is grown.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure, the method comprising:
   forming a trench isolation region that has a sidewall coextensive with a sidewall of an active device region comprised of a semiconductor material; and
   forming a dielectric region extending laterally from the sidewall of the active device region into the active device region,
   wherein the active device region comprises a collector, and the dielectric region is located beneath a top surface of the active device region such that a section of the active device region is located between the top surface and the dielectric region, and
   wherein forming the dielectric region extending laterally from the sidewall of the active device region into the active device region comprises:
   forming a trench extending partially through the trench isolation region that is coextensive with a portion of the sidewall of the active device region; and
   forming a damaged region in the semiconductor material beneath the portion of the sidewall of the active device region.

2. The method of claim 1 wherein forming the dielectric region extending laterally from the sidewall of the active device region into the active device region further comprises:
   removing the damaged region with a selective etching process that removes the damaged region at a greater etch rate than surrounding semiconductor material,
   wherein the dielectric region comprises an air gap.

3. The method of claim 2 further comprising:
   after the damaged region is removed, filling the trench with a dielectric material using a directional deposition process that preserves and closes the air gap.

4. The method of claim 1 wherein forming the dielectric region extending laterally from the sidewall of the active device region into the active device region further comprises:
   converting the damaged region of the active device region into a first dielectric material with an oxidation process.

5. The method of claim 4 further comprising:
   after the damaged region is converted into the first dielectric material, filling the trench with a second dielectric material.

6. The method of claim 1 wherein forming the damaged region in the semiconductor material beneath the portion of the sidewall of the active device region comprises:
   implanting the semiconductor material beneath the portion of the sidewall of the active device region with ions having ion trajectories directed into the trench.

7. The method of claim 6 wherein the ion trajectories are angled relative to the top surface of the device region and to the sidewall of the active device region.

8. The method of claim 1 wherein forming the trench extending partially through the trench isolation region that is coextensive with a portion of the sidewall of the active device region comprises:
   etching the trench to a first depth into the trench isolation region;
   applying spacers to the sidewall of the active device region over the first depth; and
   after the spacers are applied, etching the trench to a second depth into the trench isolation region that is greater than the first depth to expose the portion of the sidewall of the active device region between the first depth and the second depth.

9. The method of claim 8 wherein forming the damaged region in the semiconductor material beneath the portion of the sidewall of the active device region comprises:
   implanting the semiconductor material beneath the portion of the sidewall of the active device region with ions having ion trajectories directed into the trench.

10. The method of claim 9 wherein the ion trajectories are angled relative to the top surface of the device region and to the sidewall of the active device region.

11. A method of fabricating a device structure, the method comprising:
    forming a trench isolation region that has a sidewall coextensive with a sidewall of an active device region comprised of a semiconductor material having a first conductivity type;
    forming a dielectric region extending laterally from the sidewall of the active device region into the active device region; and
    introducing a dopant into a section of the active device region located between the top surface and the dielectric region,
    wherein the active device region comprises a collector, and the dielectric region is located beneath a top surface of the active device region such that the section of the active device region is located between the top surface and the dielectric region, and
    wherein introducing the dopant into the section of the active device region located between the top surface and the dielectric region comprises:
    implanting the section of the active device region with ions of a second conductivity type different from the first conductivity type.

12. The method of claim 1 comprising
    after the dielectric region is formed, forming a base layer on the active device region.

13. The method of claim 12 comprising:
    introducing a dopant into a section of the base layer overlying the section of the active device region to define an extrinsic base.

14. A device structure for a heterojunction bipolar transistor, the device structure fabricated using a semiconductor substrate, the device structure comprising:
    a trench isolation region in the semiconductor substrate, the trench isolation region having a sidewall;
    an active device region having a top surface and a sidewall coextensive with the sidewall of the trench isolation region, the active device region comprised of a portion of the semiconductor substrate, and the active device region comprising a collector; and
    a dielectric region extending laterally from the sidewall of the active device region into the active device region, the dielectric region located beneath a top surface of the active device region such that a section of the active device region is located between the top surface and the dielectric region, wherein the active device region is comprised of a semiconductor material having a first conductivity type, the active device region includes a doped section located between the top surface and the dielectric region, and the doped section of the active device region is comprised of the semiconductor material with a second conductivity type different from the first conductivity type.

15. The device structure of claim 14 wherein the active device region is comprised of a semiconductor material, the trench isolation region includes a trench that is coextensive with a portion of the sidewall, and the trench is filled with a dielectric material.

16. The device structure of claim 14 wherein the dielectric region comprises an air gap.

17. The device structure of claim 14 wherein the dielectric region is comprised of a solid dielectric material.

18. The method of claim 11 wherein the dielectric region comprises an air gap.

19. The method of claim 11 wherein the dielectric region is comprised of a solid dielectric material.

20. The method of claim 1 wherein the semiconductor material of the active device region has a first conductivity type, and comprising:

implanting the section of the active device region with ions of a second conductivity type different from the first conductivity type.

\* \* \* \* \*